United States Patent
Wang et al.

(10) Patent No.: US 10,943,554 B2
(45) Date of Patent: Mar. 9, 2021

(54) ANTI-LEAKAGE CIRCUIT FOR SHIFT REGISTER UNIT, METHOD OF DRIVING SHIFT REGISTER UNIT, GATE DRIVER ON ARRAY CIRCUIT AND TOUCH DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Zhen Wang, Beijing (CN); Jian Sun, Beijing (CN); Fei Huang, Beijing (CN); Yun Qiao, Beijing (CN); Xiaozhou Zhan, Beijing (CN); Han Zhang, Beijing (CN); Wenwen Qin, Beijing (CN); Lele Cong, Beijing (CN); Zhengkui Wang, Beijing (CN); Jianjun Zhang, Beijing (CN); Peng Liu, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/478,088

(22) PCT Filed: Dec. 11, 2018

(86) PCT No.: PCT/CN2018/120249
§ 371 (c)(1),
(2) Date: Jul. 15, 2019

(87) PCT Pub. No.: WO2019/148970
PCT Pub. Date: Aug. 8, 2019

(65) Prior Publication Data
US 2020/0356203 A1 Nov. 12, 2020

(30) Foreign Application Priority Data

Jan. 31, 2018 (CN) .......................... 201810100925.1

(51) Int. Cl.
*G09G 3/36* (2006.01)
*G06F 3/041* (2006.01)
(Continued)

(52) U.S. Cl.
CPC ......... *G09G 3/3677* (2013.01); *G06F 3/0412* (2013.01); *G09G 3/3266* (2013.01);
(Continued)

(58) Field of Classification Search
CPC ............... G09G 3/3677; G09G 3/3266; G09G 2310/0286; G11C 19/287; G11C 19/28; G06F 3/0412; G06F 3/2092
See application file for complete search history.

(56) References Cited

U.S. PATENT DOCUMENTS 10,249,243 B2 * 4/2019 Li .......................... G09G 3/3266
2010/0245337 A1 * 9/2010 Hu .......................... G11C 19/28
345/213

(Continued)

FOREIGN PATENT DOCUMENTS

CN 105185290 A 12/2015
CN 106601176 A 4/2017
(Continued)

OTHER PUBLICATIONS

First Office Action and English language translation, CN Application No. 201810100925.1, dated Mar. 27, 2019, 13 pp.
(Continued)

*Primary Examiner* — Darlene M Ritchie
(74) *Attorney, Agent, or Firm* — Myers Bigel, P.A.

(57) ABSTRACT

A shift register unit, a method of driving a shift register unit, a gate driving circuit and a touch display device are dis-
(Continued)

closed. The shift register unit includes a first signal input terminal, a first voltage control terminal, a second signal input terminal, a second voltage control terminal, a signal output terminal, a first voltage terminal, and a second voltage terminal. The shift register unit further comprises a first input circuit, a second input circuit, an output circuit, an anti-leakage circuit, a first control circuit, and a second control circuit. The anti-leakage circuit is configured to bring a first node into conduction with a second node in response to an active potential of the second voltage terminal.

16 Claims, 6 Drawing Sheets (51) Int. Cl.
G11C 19/28 (2006.01)
G09G 3/3266 (2016.01)
G09G 3/20 (2006.01)

(52) U.S. Cl.
CPC ......... *G11C 19/287* (2013.01); *G09G 3/2092* (2013.01); *G09G 2310/0286* (2013.01)

(56) References Cited

U.S. PATENT DOCUMENTS

| 2014/0133621 | A1* | 5/2014 | Shang | G11C 19/184 |
| | | | | 377/67 |
| 2015/0213746 | A1* | 7/2015 | Kim | G09G 3/3677 |
| | | | | 345/215 |
| 2016/0266699 | A1* | 9/2016 | Zhao | G06F 3/044 |
| 2017/0269769 | A1 | 9/2017 | Hu | |
| 2017/0270892 | A1* | 9/2017 | Wang | G11C 19/28 |
| 2019/0057637 | A1 | 2/2019 | Fan et al. | |

FOREIGN PATENT DOCUMENTS

| CN | 106960655 A | 7/2017 |
| CN | 107068088 A | 8/2017 |
| CN | 108257567 A | 7/2018 |
| KR | 100685842 B1 | 2/2007 |

OTHER PUBLICATIONS

Second Office Action and English language translation, CN Application No. 201810100925.1, dated Jul. 10, 2019, 8 pp.

* cited by examiner (Related Art)

FIG. 1

(Related Art)

ANTI-LEAKAGE CIRCUIT FOR SHIFT REGISTER UNIT, METHOD OF DRIVING SHIFT REGISTER UNIT, GATE DRIVER ON ARRAY CIRCUIT AND TOUCH DISPLAY DEVICE

RELATED APPLICATIONS

The present application is a 35 U.S.C. 371 national stage application of PCT International Application No. PCT/CN2018/120249, filed on Dec. 11, 2018, which claims the benefit of Chinese Patent Application No. 201810100925.1, filed on Jan. 31, 2018, the entire disclosures of which are incorporated herein by reference.

TECHNICAL FIELD

The present disclosure relates to the field of display technology, and in particular to a shift register unit, a method for driving the shift register unit, a gate driving circuit and a touch display device.

BACKGROUND

Gate driver on array (GOA) is an important technology that can be applied to touch display panels. In a common touch display panel, there may be a problem that the output voltage of the output transistor of a shift register is insufficient. This may cause a display abnormality.

SUMMARY

According to an aspect of the present disclosure, a shift register unit is provided. The shift register unit comprises: a first input circuit configured to bring a first voltage control terminal into conduction with a first node in response to an active potential of a first signal input terminal; a second input circuit configured to bring a second voltage control terminal into conduction with the first node in response to an active potential of a second signal input terminal; an output circuit configured to transmit a first active clock signal to a signal output terminal in response to an active potential of a second node; a first control circuit configured to bring a first voltage terminal into conduction with a third node in response to an active potential of the first node, and maintain the third node at a first potential in response to a second inactive clock signal and an inactive potential of the first node; a second control circuit configured to, in response to an active potential of the third node, bring the first node into conduction with the first voltage terminal and bring the signal output terminal into conduction with the first voltage terminal; and an anti-leakage circuit configured to bring the first node into conduction with the second node in response to an active potential of a second voltage terminal.

In some embodiments, the first control circuit is configured to, in response to a second active clock signal, transmit the second active clock signal to the third node and store charges from the second active clock signal; and in response to the second inactive clock signal and the inactive potential of the first node, output the charges that have been stored to the third node, such that the third node maintains at the first potential.

In some embodiments, the first potential is different from a potential of the first voltage terminal.

In some embodiments, the anti-leakage circuit comprises a first transistor, a gate of the first transistor is connected to the second voltage terminal, one of a source and a drain of the first transistor is connected to the first node, and the other one of the source and the drain of the first transistor is connected to the second node.

In some embodiments, the first input circuit comprises a second transistor, a gate of the second transistor is connected to the first signal input terminal, one of a source and a drain of the second transistor is connected to the first voltage control terminal, and the other one of the source and the drain of the second transistor is connected to the first node.

In some embodiments, the second input circuit comprises a third transistor, a gate of the third transistor is connected to the second signal input terminal, one of a source and a drain of the third transistor is connected to the first node, and the other one of the source and the drain of the third transistor is connected to the second voltage control terminal.

In some embodiments, the output circuit comprises a fourth transistor and a first capacitor. A gate of the fourth transistor is connected to the second node, one of a source and a drain of the fourth transistor is configured to receive the first active clock signal, and the other one of the source and the drain of the fourth transistor is connected to the signal output terminal. One terminal of the first capacitor is connected to the second node, and the other terminal of the first capacitor is connected to the signal output terminal.

In some embodiments, the first control circuit comprises a fifth transistor, a sixth transistor, and a second capacitor. A gate and one of a source and a drain of the fifth transistor are configured to receive the second active clock signal or the second inactive clock signal, and the other one of the source and the drain of the fifth transistor is connected to the third node. A gate of the sixth transistor is connected to the first node, one of a source and a drain of the sixth transistor is connected to the third node, and the other one of the source and the drain of the sixth transistor is connected to the first voltage terminal. One terminal of the second capacitor is connected to the third node, and the other terminal of the second capacitor is connected to the first voltage terminal.

In some embodiments, the first control circuit further comprises a seventh transistor. A gate of the seventh transistor is connected to the signal output terminal, one of a source and a drain of the seventh transistor is connected to the third node, and the other one of the source and the drain of the seventh transistor is connected to the first voltage terminal.

In some embodiments, the second control circuit comprises an eighth transistor and a ninth transistor. A gate of the eighth transistor is connected to the third node, one of a source and a drain of the eighth transistor is connected to the first node, and the other one of the source and the drain of the eighth transistor is connected to the first voltage terminal. A gate of the ninth transistor is connected to the third node, one of a source and a drain of the ninth transistor is connected to the signal output terminal, and the other of the source and the drain of the ninth transistor is connected to the first voltage terminal.

In some embodiments, the transistors respectively comprised in the first input circuit, the second input circuit, the output circuit, the first control circuit, the second control circuit, and the anti-leakage circuit are single-gate transistors.

In some embodiments, all of the transistors are N-type transistors or are P-type transistors.

According to another aspect of the present disclosure, a method of driving the shift register unit as described in any one of the embodiments of the present disclosure is provided. The method comprises: in a display phase, controlling a voltage of the second voltage terminal of the shift register unit to be a first voltage, such that the first node is brought into conduction with the second node by the anti-leakage circuit of the shift register unit; and, in a touch phase, controlling a voltage of the second voltage terminal of the shift register unit to be a second voltage, such that the first node is brought out of conduction with the second node by the anti-leakage circuit of the shift register unit.

In some embodiments, the method further comprises: in the touch phase, controlling a voltage of the first voltage control terminal of the shift register unit and a voltage of a second voltage control terminal of the shift register unit to be both at high potentials, such that a potential of the first node of the shift register unit is maintained in the touch phase.

According to yet another aspect of the present disclosure, a gate driving circuit is provided. The gate driving circuit comprises N cascaded shift register units as described in any one of the embodiments of the present disclosure. N is an integer greater than or equal to two. Among the N shift register units:

the first signal input terminal of an $m^{th}$ one of the N cascaded shift register units is connected to the signal output terminal of an $(m-1)^{th}$ one of the N cascaded shift register units, wherein m is an integer and $2 \leq m \leq N$, and a second signal input terminal of an $n^{th}$ one of the N cascaded shift register units is connected to the signal output terminal of an $(n+1)^{th}$ one of the N cascaded shift register units, wherein n is an integer and $1 \leq n < N$.

In some embodiments, the first signal input terminal of a $1^{st}$ one of the N cascaded shift register units is configured to receive a forward scan input signal, and a second signal input terminal of an $N^{th}$ one of the N cascaded shift register units is configured to receive a reverse scan input signal.

According to still another aspect of the present disclosure, a touch display device is provided. The touch display device comprises the gate driving circuit according to any one of the embodiments of the present disclosure.

BRIEF DESCRIPTION OF THE DRAWINGS

These and other aspects of the present disclosure will be apparent from the embodiments described below, and will be further elucidated by way of example with reference to the drawings, in which.

DETAILED DESCRIPTION OF THE EMBODIMENTS

Several embodiments of the present disclosure will be described in more detail below with reference to the drawings in order to enable those skilled in the art to practice the present disclosure. However, the present disclosure may be embodied in many different forms and should not be construed as being limited to the embodiments set forth herein. Rather, these embodiments are provided so that this disclosure will be thorough and complete, and will fully convey the scope of the disclosure to those skilled in the art. The described embodiments do not limit the disclosure. Further, the terms used in the detailed description of the specific embodiments shown in the drawings do not intent to limit this disclosure. Based on the embodiments of the present disclosure, all other embodiments obtained by those of ordinary skill in the art without doing any creative works are within the protective scope of the present disclosure.

In recent years, the development of touch display panels has shown a trend of high integration and low cost. A very important technology is the mass production of the GOA. By integrating the gate driving circuit on the array substrate of the display panel using a GOA technology, the gate driving integrated circuit part can be omitted to reduce the product cost in both aspects of the material cost and the manufacturing process. Such a gate driving circuit integrated on an array substrate using the GOA technology is also referred to as a GOA circuit or a shift register circuit. Each shift register in the gate driving circuit is also referred to as a shift register unit. The shift register circuit comprises several shift register units. Each shift register unit corresponds to a gate line. Specifically, the output terminal of each shift register unit is connected to a gate line, and the output terminal of one shift register unit is connected to the input terminal of the next one shift register unit.

Figure 1:
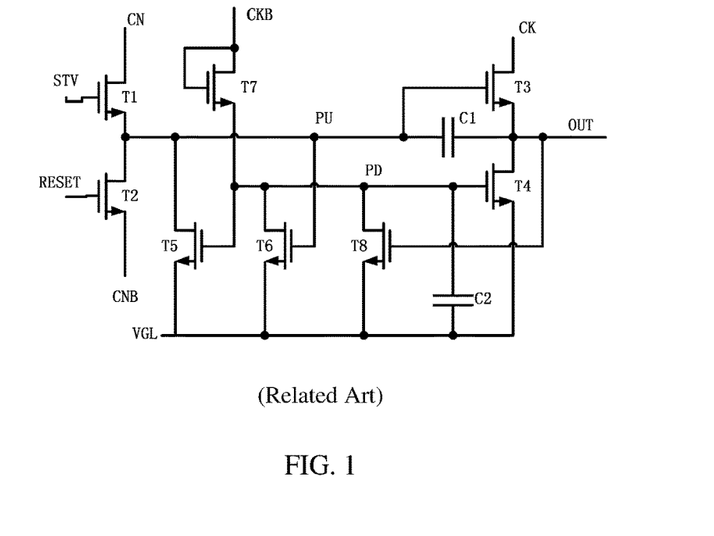
FIG. 1 schematically shows a circuit structure of a related 8T2C shift register unit.
Figure 2:
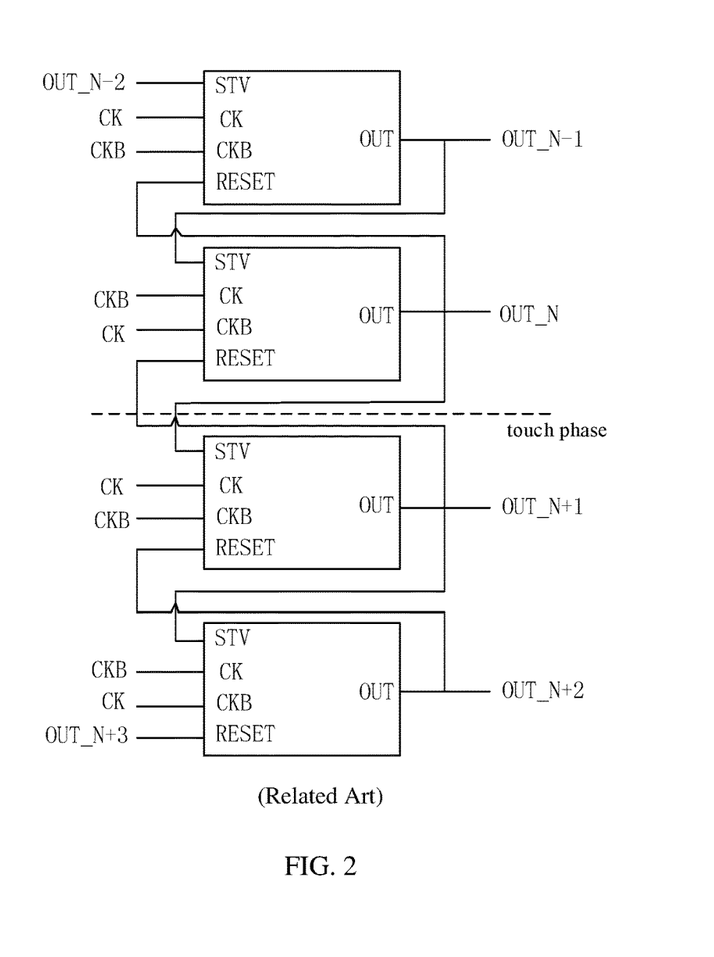
FIG. 2 schematically shows a structure of a gate driving circuit formed using the shift register units of FIG. 1.

FIG. 1 schematically shows a circuit structure of a related 8T2C shift register unit. It should be noted that the 8T2C shift register unit means a shift register unit comprising eight transistors and two capacitors. The shift register unit has two signal input terminals—the STV and RESET, and two voltage control terminals—the CN and CNB. The shift register unit is configured to receive a first active clock signal or a first inactive clock signal and to receive a second active clock signal or a second inactive clock signal. In some embodiments, it can be understood that the shift register unit according to the present disclosure comprises a first clock signal terminal CK and a second clock signal terminal CKB. The first clock signal terminal CK is configured to receive the first active clock signal or the first inactive clock signal, and the second clock signal terminal CKB is configured to receive the second active clock signal or the second inactive clock signal. When the shift register unit is receiving the first active clock signal, the first clock signal terminal CK is at a high potential. When the shift register unit is receiving the first inactive clock signal, the first clock signal terminal CK is at a low potential. When the shift register unit is receiving the second active clock signal, the second clock signal terminal CKB is at a high potential. When the shift register unit is receiving the second inactive clock signal, the second clock signal terminal CKB is at a low potential. In a non-touch phase, when the first clock signal terminal CK is at a low potential, the second clock signal terminal CKB is at a high potential. When the first clock signal terminal CK is at a high potential, the second clock signal terminal CKB is at a low potential. Therefore, in this case, the signal received by the first clock signal terminal CK and the signal received by the second clock signal terminal CKB are complementary signals. VGL is a DC signal at low level. The voltage control terminal CN and the voltage control terminal CNB are a pair of voltage control terminals for implementing forward and reverse scans. FIG. 2 schematically shows a structure of a gate driving circuit formed by the shift register units of FIG. 1. The gate driving circuit can implement forward and reverse scans. Specifically, if CN is at a high level and CNB is at a low level, the gate driving circuit implements a forward scan, and in this case, STV is a signal input terminal of the forward scan. If CN is at a low level and CNB is at a high level, the gate driving circuit implements reverse scan, and in this case, RESET is a signal input terminal of the reverse scan. As shown in FIG. 2, the STV of a shift register unit at one stage (e.g., the $N^{th}$ one of the shift register units) is connected to the output terminal OUT of a shift register unit at a previous one stage (e.g., the $(N-1)^{th}$ one of the shift register units), and the RESET of this stage shift register unit at the one stage is connected to the output terminal of a shift register unit at a next one stage (e.g., the $(N+1)^{th}$ one of the shift register units). It should be noted that the wordings "high level" and "high potential" may have an equivalent meaning, so do the wordings "low level" and "low potential".

Figure 3:
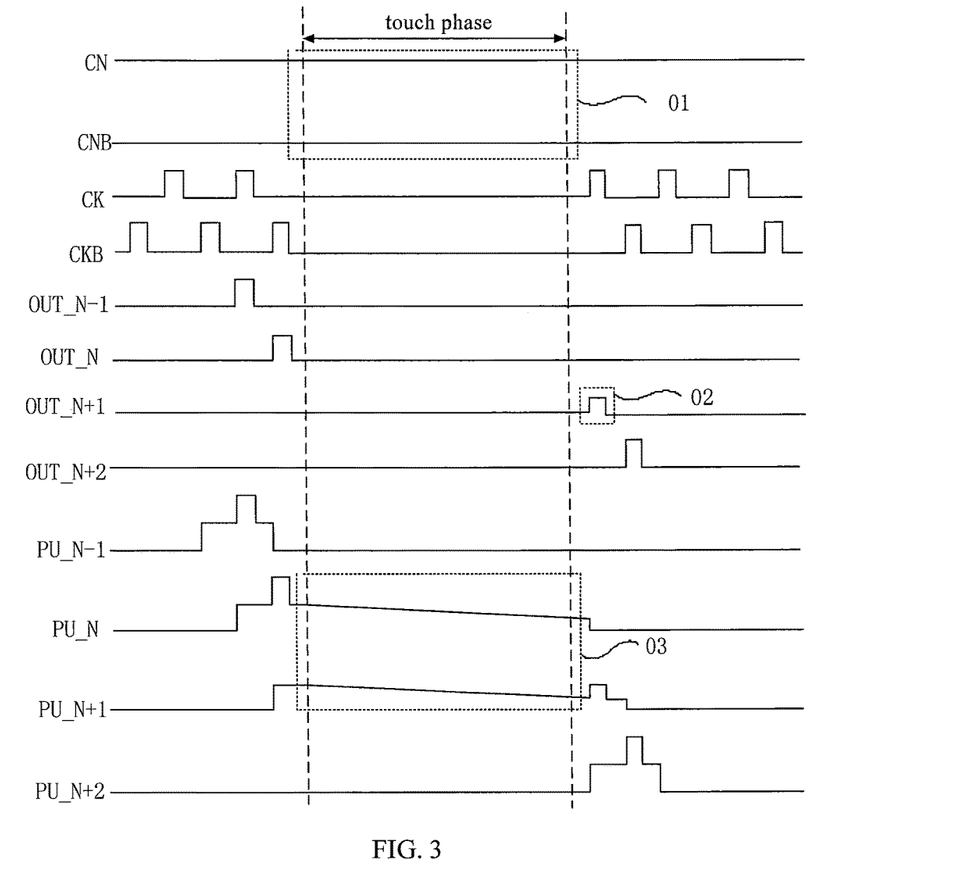
FIG. 3 schematically shows a timing control diagram of the gate driving circuit of FIG. 2 in a forward scan.
Figure 4:
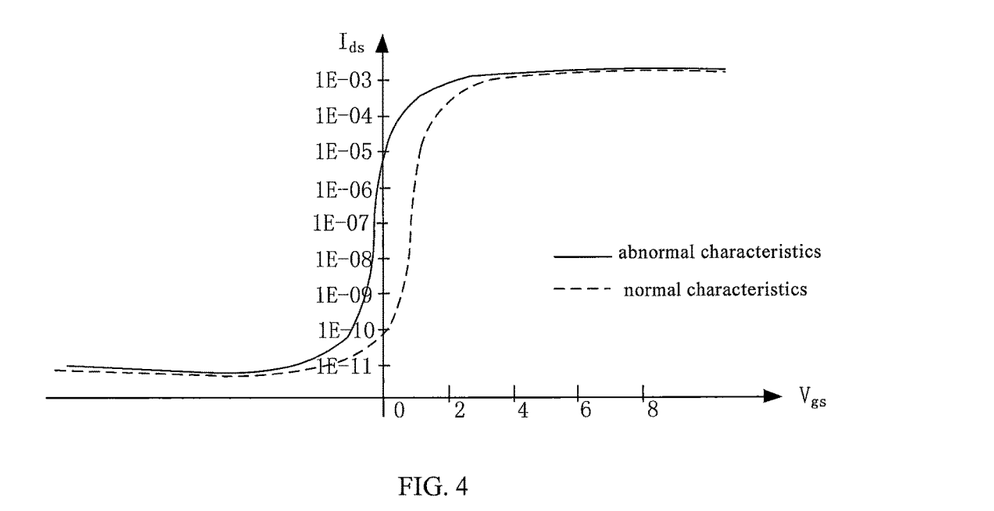
FIG. 4 schematically shows a characteristic curve of a transistor with normal characteristics and a characteristic curve of a transistor with abnormal characteristics.

FIG. 3 schematically shows a timing control diagram of the gate driving circuit of FIG. 2 in a forward scan. FIG. 4 schematically shows characteristic curves of transistors, one of which has normal characteristics and the other one of which has abnormal characteristics. Referring to FIG. 2, after the $N^{th}$ shift register unit outputting the OUT_N signal, the display panel enters the touch phase, and after the touch phase is over, the display panel enters the display phase again, and the $(N+1)^{th}$ shift register unit continues to output the OUT_N+1 signal. As shown in FIG. 3, in the touch phase, the second node PU_N+1 of the $(N+1)^{th}$ shift register unit is at a high level, CN is at a high level, and CNB is at a low level. Therefore, the charges at the second node PU may leak through the transistor T2.

Specifically, the gate-source voltage of the transistor T2 is 0V, and the source-drain voltage is a voltage difference between the high level and the low level. According to FIG. 4, if the characteristics of a transistor in the shift register unit is normal, then when the gate-source voltage $V_{gs}$=0 V, the magnitude of the leakage current $I_{ds}$ is on the order of $1\times10^{-10}$ (also referred to as 1E-10). For a transistor with normal characteristics, after the touch phase, the second node PU_N+1 of the $(N+1)^{th}$ shift register unit can still be maintained at a high level, so that after the touch phase is over, the pixel would not experience an insufficient charging. If the characteristics of a transistor in the shift register unit is abnormal, then when the gate-source voltage $V_{gs}$=0V, the magnitude of the leakage current $I_{ds}$ is on the order of 1E-5. In this case, as shown in FIG. 3, in the touch phase, an amplitude of the second node PU_N+1 of the $(N+1)^{th}$ shift register unit is reduced (as shown by box 03 in FIG. 3). Therefore, after the touch phase is over, the transistor T3 cannot be completely turned on, which causes the output voltage of the OUT_N+1 terminal to be insufficient (as shown by box 02 in FIG. 3). This can in turn easily result in insufficient pixel charging and display abnormality.

It should be noted that, in the art, when the magnitude the leakage current $I_{ds}$ of the transistor is greater than the order of 1E-5, after the touch phase, as shown in FIG. 3, the amplitude of the second node PU_N+1 of the shift register unit that needs to be initiated after the touch phase is over (i.e., the $(N+1)^{th}$ shift register unit) is reduced, resulting in insufficient pixel charging.

In summary, for the shift register unit that needs to be initiated after the touch phase is over of a common touch display panel, due to current leakage of its second node in the touch phase, there is a problem that the output voltage of this shift register unit is insufficient after the touch phase is over, resulting in insufficient pixel charging and display abnormality.

Figure 5:
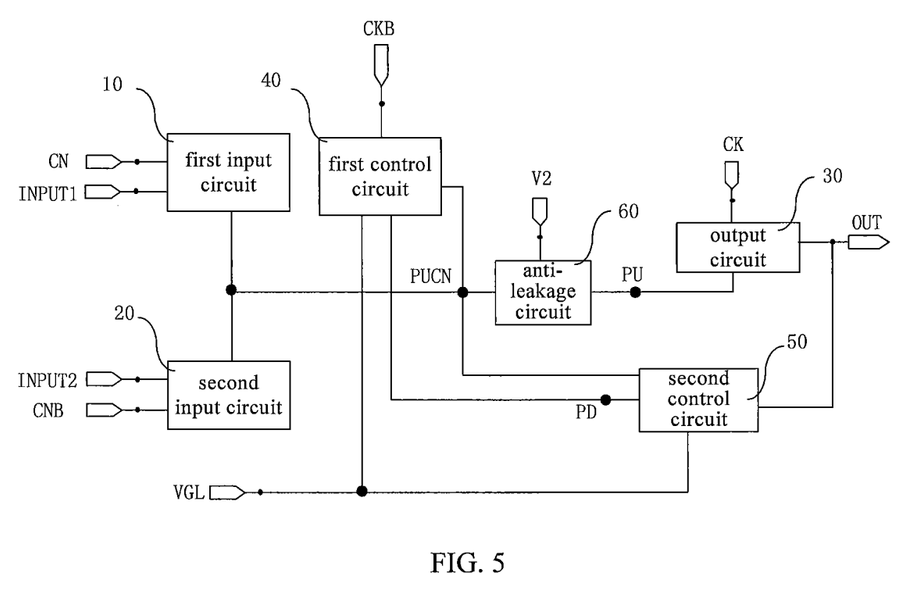
FIG. 5 schematically shows a structural block diagram of a shift register unit according to an embodiment of the present disclosure.

In order to solve the above problems, embodiments of the present disclosure provide a shift register unit. FIG. 5 schematically shows a structural block diagram of a shift register unit according to an embodiment of the present disclosure. The shift register unit comprises a first signal input terminal INPUT1, a first voltage control terminal CN, a second signal input terminal INPUT2, a second voltage control terminal CNB, a signal output terminal OUT, a first voltage terminal VGL, and a second voltage terminal V2. It should be understood that each of the above terminals does not imply that the shift register unit according to the present disclosure necessarily comprises a physical terminal. In some embodiments, a terminal may represent a node of a circuit in the shift register unit, through which an electrical signal may be received or some part of the circuit of the shift register unit may be connected to a potential. The shift register unit further comprises a first input circuit 10, a second input circuit 20, an output circuit 30, a first control circuit 40, a second control circuit 50, and an anti-leakage circuit 60.

The first input circuit 10 is connected to the first signal input terminal INPUT1, the first node PUCN and the first voltage control terminal CN. The first input circuit 10 is configured to bring the first voltage control terminal CN into conduction with the first node PUCN, that is, to make the potential of the first node PUCN the same as the potential of the first voltage control terminal CN, in response to an active potential of the first signal input terminal INPUT1. The term "active potential" refers to a potential applied to the gate of a transistor that turns the transistor on, i.e. brings the source into conduction with the drain.

The second input circuit 20 is connected to the second signal input terminal INPUT2, the first node PUCN and the second voltage control terminal CNB. The second input circuit 20 is configured to bring the second voltage control terminal CNB into conduction with the first node PUCN, that is, to make the potential of the first node PUCN the same as the potential of the second voltage control terminal CNB, in response to an active potential of the second signal input terminal INPUT2.

The output circuit 30 is connected to the second node PU and the signal output terminal OUT. The output circuit 30 is configured to bring the first clock signal terminal CK into conduction with the signal output terminal OUT, that is, to transmit the first active clock signal from the first clock signal terminal CK to the signal output terminal OUT, in response to an active potential of the second node PU.

The first control circuit 40 is connected to the first node PUCN, the first voltage terminal VGL and the third node PD. The first control circuit 40 is configured to bring the first voltage terminal VGL into conduction with the third node PD in response to the active potential of the first node PUCN, such that the potential of the first voltage terminal VGL is the same as the potential of the third node PD. The first control circuit 40 is further configured to maintain the third node PD at a first potential in response to the second inactive clock signal and the inactive potential of the first node, the first potential being different from the potential of the first voltage terminal VGL. Specifically, the first control circuit 40 is configured to, in response to the second active clock signal, store charges from the second active clock signal and transmit the second active clock signal to the third node PD, such that the potential of the third node PD is equal to the potential of the second active clock signal (i.e., the potential of the second clock signal terminal CKB), and is further configured to release the stored charges which are from the second active clock signal to the third node PD. The term "inactive potential" refers to a potential applied to the gate of a transistor that turns the transistor off, i.e. brings the source out of conduction with the drain.

Figure 6:
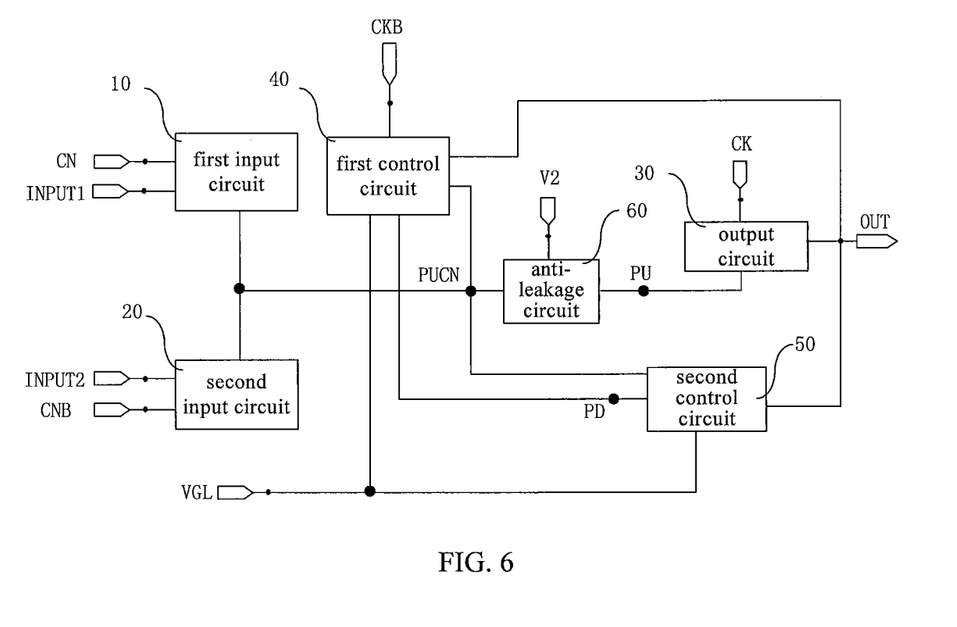
FIG. 6 schematically shows a structural block diagram of a shift register unit according to another embodiment of the present disclosure.

FIG. 6 schematically shows a structural block diagram of a shift register unit according to another embodiment of the present disclosure. Optionally, as shown in FIG. 6, the first control circuit 40 is further connected to the signal output terminal OUT, and is further configured to bring the first voltage terminal VGL into conduction with the third node PD in response to the active potential of the signal output terminal OUT, such that the potential of the third node PD is the same as the potential of the first voltage terminal VGL.

The second control circuit 50 is connected to the third node PD, the first node PUCN, the first voltage terminal VGL and the signal output terminal OUT. The second control circuit 50 is configured to, in response to the active potential of the third node PD, bring both the first node PUCN and the signal output terminal OUT into conduction with the first voltage terminal VGL, that is, the potential of the first node PUCN and the potential of the signal output terminal OUT are pulled down to the potential of the first voltage terminal VGL.

The anti-leakage circuit 60 is connected to the first node PUCN, the second voltage terminal V2, and the second node PU. The anti-leakage circuit 60 is configured to bring the first node PUCN into conduction with the second node PU in response to an active potential of the second voltage terminal V2.

In the display phase of the display panel, the shift register unit provided by the embodiments of the present disclosure can control the anti-leakage circuit 60 of the shift register unit to bring the first node PUCN into conduction with the second node PU, such that the potential of the first node PUCN is equal to the potential of the second PU, which makes the output voltage of the shift register unit in this stage is normal for normal display. Moreover, in the touch phase, the anti-leakage circuit 60 of the shift register unit is in an off state, so that the first node PUCN is out of conduction with the second node PU. Thus, the leakage of the first node PUCN during the touch phase does not cause the leakage of the second node PU to avoid the leakage of the second node PU during the touch phase. This can in turn prevent the output voltage of the shift register unit that needs to be initiated after the touch phase is over from being insufficient, which results in insufficient pixel charging and display abnormality.

Figure 7:
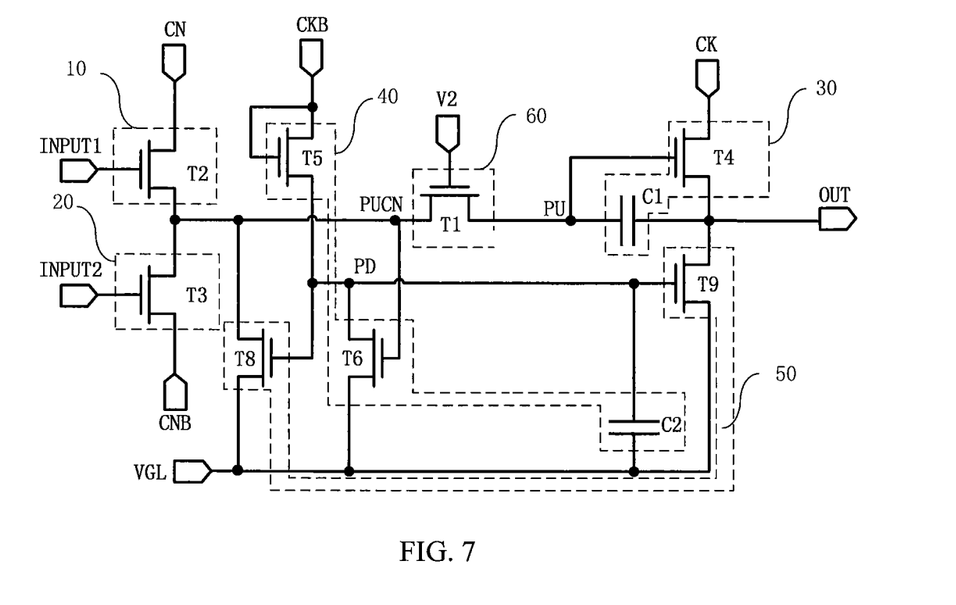
FIG. 7 schematically shows a circuit structure of a shift register unit according to an embodiment of the present disclosure.
Figure 8:
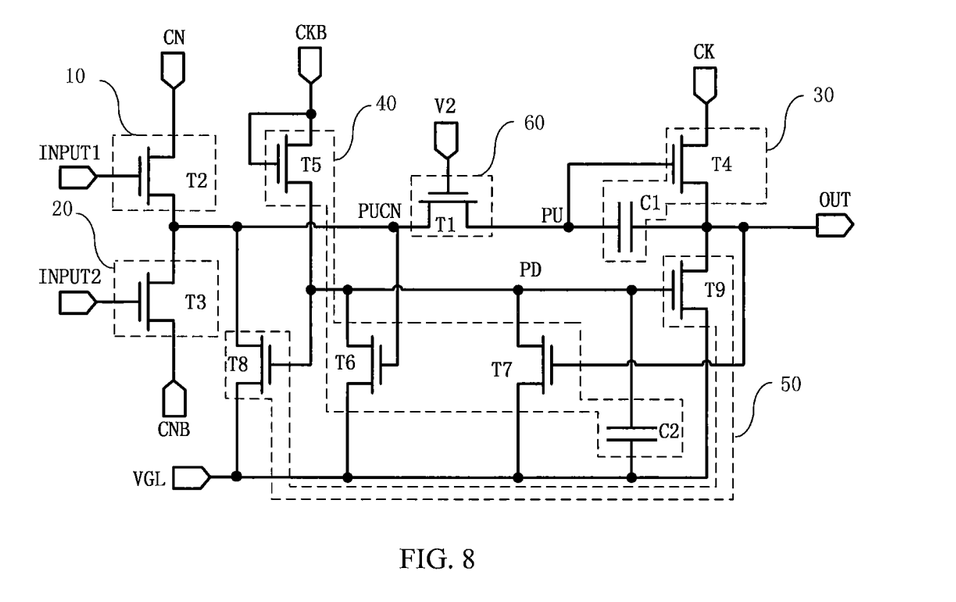
FIG. 8 schematically shows a circuit structure of a shift register unit according to another embodiment of the present disclosure.

FIG. 7 and FIG. 8 schematically show the circuit structures of shift register units according to two embodiments of the present disclosure, respectively. The specific structures of the circuits of the shift register units provided by the embodiments of the present disclosure will be exemplified below in conjunction with FIG. 7 and FIG. 8.

Referring to FIG. 7, the anti-leakage circuit 60 comprises a first transistor T1, a gate of the first transistor T1 is connected to a second voltage terminal V2, one of a source and a drain is connected to a first node PUCN, and the other one of the source and the drain is connected to the second node PU. The first input circuit 10 comprises a second transistor T2. A gate of the second transistor T2 is connected to a first signal input terminal INPUT1, one of a source and a drain is connected to the first voltage control terminal CN, and the other one of the source and the drain is connected to the first node PUCN. The second input circuit 20 comprises a third transistor T3. A gate of the third transistor T3 is connected to the second signal input terminal INPUT2, one of a source and a drain is connected to the second voltage control terminal CNB, and the other one of the source and the drain is connected to the first node PUCN. The output circuit 30 comprises a fourth transistor T4 and a first capacitor C1. A gate of the fourth transistor T4 is connected to the second node PU, one of a source and a drain is configured to receive the first active clock signal or the first inactive clock signal, and the other one of the source and the drain is connected to the signal output terminal OUT. One terminal of the first capacitor C1 is connected to the second node PU, and the other terminal is connected to the signal output terminal OUT. The first control circuit 40 comprises a fifth transistor T5, a sixth transistor T6, and a second capacitor C1. A gate and one of a source and a drain of the fifth transistor T5 are configured to receive the second active clock signal or the second inactive clock signal, and the other one of the source and the drain is connected to the third node PD. A gate of the sixth transistor T6 is connected to the first node PUCN, one of a source and a drain is connected to the third node PD, and the other one of the source and the drain is connected to the first voltage terminal VGL. One terminal of the second capacitor C1 is connected to the third node PD, and the other terminal is connected to the first voltage terminal VGL. The second control circuit 50 comprises an eighth transistor T8 and a ninth transistor T9. A gate of the eighth transistor T8 is connected to the third node PD, one of a source and a drain is connected to the first node PUCN, and the other of the source and the drain is connected to the first voltage terminal VGL. A gate of the ninth transistor T9 is connected to the third node PD, one of a source and a drain is connected to the signal output terminal OUT, and the other one of the source and the drain is connected to the first voltage terminal VGL.

In another embodiment, referring to FIG. 8, the first control circuit 40 further comprises a seventh transistor T7. A gate of the seventh transistor T7 is connected to the signal output terminal OUT, one of a source and a drain is connected to the third node PD, and the other one of the source and the drain is connected to the first voltage terminal VGL.

It should be noted that the present disclosure does not limit any of the mentioned transistors as a single transistor. Any one of the mentioned transistors may be a plurality of transistors in series. FIG. 7 and FIG. 8 describes the present disclosure under the example that the term such as "$n^{th}$ transistor" comprises one transistor. In embodiments of the present disclosure, the above transistors may all be P-type transistors or N-type transistors. When the above transistors are all P-type transistors, the term "one of a source and a drain" is specifically the source, and the term "the other one of the source and the drain" is specifically a drain. For example, when the first transistor is a P-type transistor, the expression "one of a source and a drain of the first transistor is connected to the first node, and the other one of the source and the drain of the first transistor is connected to the second node" can be understood as the source of the first transistor is connected to the first node, and the drain of the first transistor is connected to the second node. When the above transistors are all N-type transistors, the term "one of a source and a drain" is a drain, and the term "the other one of the source and the drain" is a source. The embodiments of the present disclosure are explained under the example that each transistor is an N-type transistor.

The above transistors may be double-gate transistors or single-gate transistors. Generally, the leakage current of a single-gate transistor is larger than that of a double-gate transistor, making the stability of the shift register unit relatively poor. Since the second node PU of the shift register unit of the embodiments of the present disclosure has relatively strong anti-leakage capability in the touch phase, when the transistors are all single-gate transistors, the problem of poor stability of the shift register unit caused by a relatively large leakage current of single-gate transistors can be avoided.

In addition, when the above transistors are all single-gate transistors, the wiring space of the shift register unit can be reduced, thereby achieving a narrower frame of the touch display panel. Moreover, the wiring space can also be reduced such as by proportionally reducing the width and length of the transistor, thereby achieving a narrow frame of the touch display panel. The embodiments of the present disclosure do not limit this.

In addition, the gate driving circuit constituted by the shift register unit provided by the embodiments of the present disclosure can implement a bidirectional scan of the gate lines. Specifically, when the first voltage control terminal CN outputs a constant high level, and the second voltage control terminal CNB outputs a constant low level, the gate driving circuit can perform a forward scan. When the first voltage control terminal CN outputs a constant low level, and the second voltage control terminal CNB outputs a constant high level, the gate driving circuit can perform a reverse scan.

The specific operation processes of the shift register units of FIG. 7 and FIG. 8 for forward scans will be described below, all transistors in the shift register units being N-type transistors. When the shift register unit is used for a forward scan, CN=1, CNB=0. "1" represents a high level and "0" represents a low level.

In an image frame, in the display phase, the voltage of the second voltage terminal V2 of the shift register unit is controlled to be an active first voltage, so that the anti-leakage circuit 60 of the shift register unit is in a state that the first node PUCN and the second node PU are allowed to be brought into conduction. The display phase comprises an input phase, an output phase, and a reset phase.

Specifically, the above first voltage is a high level signal. Under the control of the second voltage terminal V2, the first transistor T1 is turned on, and the potential of the first node PUCN is the same as the potential of the second node PU.

In the input phase, in response to the active potential of the first signal input terminal INPUT1, the first voltage control terminal CN is brought into conduction with the second node PU. In this case, the potential of the first voltage control terminal CN is the same as the potential of the second node PU. Specifically, INPUT1=1, INPUT2=0, CKB=1, CK=0, PD=0, OUT=0, PUCN=PU=1. It should be understand that the expression of "PUCN=PU=1" does not mean the actual potential at the node PUCN has to be exactly the same as the actual potential at the node PU. This expression only means that these two nodes are both at high potentials. In this case, in response to the active potential of the first signal input terminal INPUT1, the second transistor T2 is turned on, and the high level of the first voltage control terminal CN is transmitted to the first node PUCN through the second transistor T2. Meanwhile, in response to the active potential of the second voltage terminal V2, the charges at the first node PUCN are transmitted to the second node PU through the first transistor T1, and are stored by the first capacitor C1.

In response to the second active clock signal (i.e., the active potential of the second clock signal terminal CKB), the fifth transistor T5 is turned on, the second clock signal terminal CKB is brought into conduction with the third node PD, and the second active clock signal is transmitted to the third node PD through the fifth transistor T5. In response to the active potential of the first node PUCN, the sixth transistor T6 is turned on, and the low potential of the first voltage terminal VGL is transmitted to the third node PD through the sixth transistor T6. By setting the size ratio of the fifth transistor T5 and the sixth transistor T6, for example by setting the aspect ratio of the sixth transistor T6 to be larger than the aspect ratio of the fifth transistor T5, the third node PD can be made at a low level. In response to the inactive potential of the third node PD, the eighth transistor T8 and the ninth transistor T9 are turned off. In response to the inactive potential of the second signal input terminal INPUT2, the third transistor T3 is turned off.

In response to the active potential of the second node PU, the fourth transistor T4 is turned on, and the first inactive clock signal is transmitted to the signal output terminal OUT through the fourth transistor T4. Therefore, in the input phase, the signal output terminal OUT does not output gate scan signals.

In the output phase, in response to the active potential of the second node PU, the output circuit 30 outputs the signal of the first clock signal terminal CK to the signal output terminal OUT as a gate scan signal. Specifically, INPUT1=0, INPUT2=0, CKB=0, CK=1, PD=0, OUT=1, PUCN=PU=1. Since the first signal input terminal INPUT1 outputs a low level, the second transistor T2 is at an off state. The first capacitor C1 uses the stored charges to charge the second node PU to maintain the potential of the second node PU, such that the fourth transistor T4 is maintained in an on state. In this case, the first active clock signal is transmitted as a gate scan signal to the signal output terminal OUT through the fourth transistor T4 for scanning the gate lines connected to the signal output terminal OUT. Furthermore, under the bootstrap effect of the first capacitor C1, the potentials of the second node PU and the first node PUCN are further increased.

Further, in response to the second inactive clock signal, the fifth transistor T5 is turned off. In response to the active potential of the first node PUCN, the sixth transistor T6 is turned on, the third node PD is brought into conduction with the first voltage terminal VGL, and the high potential of the third node PD is pulled down to the low potential of the first voltage terminal VGL.

In an embodiment that the first control circuit further comprises a seventh transistor T7, when the output signal of the signal output terminal OUT is at a high level, the seventh transistor T7 is turned on. This further ensures that the third node PD is at a low level, thereby enhancing the output drive capability of the shift register unit.

In the reset phase, in response to the active potential of the second signal input terminal INPUT2, the potential of the second node PU is pulled down to the potential of the second voltage control terminal CNB through the second input circuit 20. The first control circuit 40 stores the charges of the second active clock signal. Under the control of the second active clock signal, the charges from the second active clock signal are output to the third node PD, or the stored charges are discharged (released) to the third node PD, so that the third node is maintained at a first potential different from the potential of the first voltage terminal VGL. Under the control of the first potential of the third node PD, the potentials of the first node PUCN and the signal output terminal OUT are pulled down to the potential of the first voltage terminal VGL through the second control circuit 50. Specifically, INPUT1=0, INPUT2=1, CKB=1, CK=0, OUT=0, PUCN=PU=0, PD=1. In this case, in response to the inactive potential of the first signal input terminal INPUT1, the second transistor T2 is turned off. In response to the active potential of the second signal input terminal INPUT2, the third transistor T3 is turned on, thus the second voltage control terminal CNB is brought into conduction with the first node PUCN, so that the potential of the first node is equal to the low level of the second voltage control terminal CNB. Also, in response to the active potential of the second voltage terminal, the first transistor T1 is turned on, and the low level of the first node PUCN is transmitted to the second node PU. In response to the inactive potential of the first node PUCN, the sixth transistor T6 is turned off. In response to the inactive potential of the second node PU, the fourth transistor T4 is turned off. In response to the second active clock signal, the fifth transistor T5 is turned on, the second active clock signal is transmitted to the third node PD through the fifth transistor T5, and the second capacitor C2 stores the charges from the second clock active signal. In response to the active potential of the third node PD, the eighth transistor T8 and the ninth transistor T9 are turned on. The potentials of the first node PUCN and the second node PU are pulled down to the low level of the first voltage terminal VGL through the eighth transistor T8. The potential of the signal output terminal OUT is pulled down to the low level of the first voltage terminal VGL through the ninth transistor T9.

Next, before the next image frame, in response to the inactive potential of the second signal input terminal INPUT2, the third transistor T3 is turned off. When receiving the second active clock signal, the second clock signal terminal CKB is brought into conduction with the third node PD, the second active clock signal is transmitted to the third node PD through the fifth transistor T5, and the second capacitor C2 stores the charges from the second active clock signal. When receiving the second inactive clock signal, the second capacitor C2 may output the stored charges to the third node PD, such that the third node PD is maintained at a high level. Thereby, before the next image frame, in response to the active potential of the third node PD, the eighth transistor T8 is turned on, and the potential of the first node PUCN can be pulled down to the low level of the first voltage terminal VGL through the eighth transistor T8. The first control circuit 40 and the second control circuit 50 repeat the process.

The above is the operation process of the shift register unit in the display phase. Next, the operation process of the shift register unit in the touch phase will be described. In the touch phase, the signals of the first clock signal terminal CK and the second clock signal terminal CKB are both inactive signals (i.e., the shift register unit receives the first inactive clock signal and the second inactive clock signal), and thus in this phase, the shift register unit does not output gate scan signals.

Figure 9:
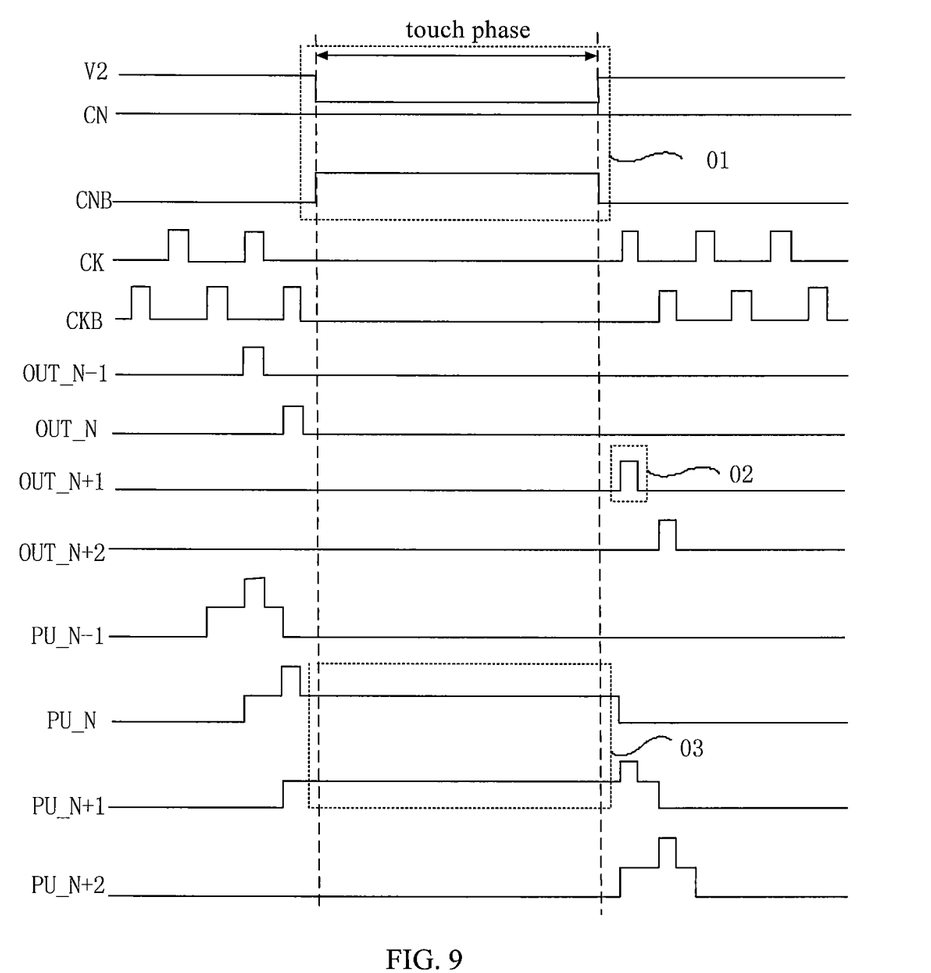
FIG. 9 schematically shows a timing control diagram of a gate driving circuit according to an embodiment of the present disclosure in a touch phase.
Figure 10:
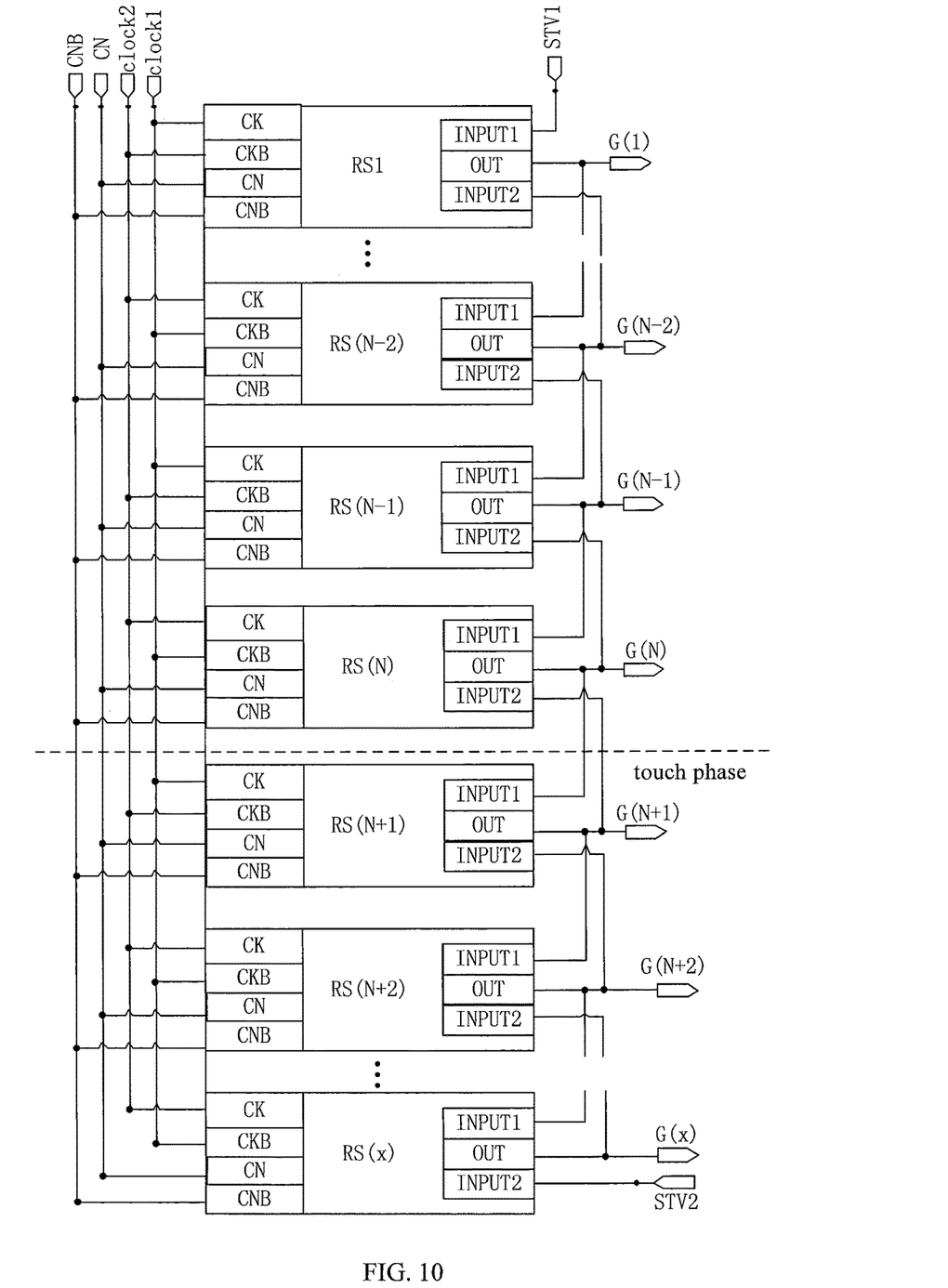
FIG. 10 schematically shows a structure of a gate driving circuit formed by the shift register units of an embodiment of the present disclosure.

FIG. 9 schematically shows a timing control diagram of a gate driving circuit according to an embodiment of the present disclosure in a touch phase. FIG. 10 schematically shows a structure of a gate driving circuit formed by shift register units of an embodiment of the present disclosure. As shown in FIG. 9, in the touch phase, the voltage of the second voltage terminal V2 of the shift register unit is controlled to be a second voltage different from the first voltage. As mentioned above, the first voltage is the active voltage that turns transistor T1 on. Therefore, the second voltage is an inactive voltage, so that the anti-leakage circuit 60 of the shift register unit is in an off state, the first node PUCN is brought out of conduction with the second node PU, and the potential of the first node PUCN cannot be transmitted to the second node PU. When the transistor is N-type, the second voltage is a low level signal. Under the control of the second voltage terminal V2, the first transistor T1 is turned off, and the potential of the first node PUCN cannot be transmitted to the second node PU. Specifically, if a shift register unit needs to be initiated right after the touch phase (i.e., the RS(N+1)$^{th}$ shift register unit in FIG. 10), then in the touch phase, CN=1, CNB=0, INPUT1=0, INPUT2=0, (PUCN_N+1)=1, (PU_N+1)=1, PD=0, CK=0, CKB=0.

In this case, the third transistor T3 is in an on state, the first node PUCN_N+1 is brought into conduction with the first voltage terminal VGL of low potential, and the charges at the first node PUCN_N+1 would leak through the third transistor T3. Since the second voltage terminal V2 is at a low level, the first node PUCN_N+1 is brought out of conduction with the second node PU_N+1, and the potential of the first node PUCN_N+1 cannot be transmitted to the second node PU_N+1, so in the touch phase the leakage at the first node PUCN_N+1 would not cause leakage of the second node PU_N+1, and the second node PU_N+1 can be maintained at a high level (as shown by box 03 of FIG. 9). Therefore, after the touch phase is over, the RS (N+1)$^{th}$ shift register unit can normally output the OUT_N+1 signal (as shown by box 02 of FIG. 9), so that leakage of the second node PU_N+1 in the touch phase can be avoided. This can in turn prevent the output voltage of the RS (N+1)$^{th}$ shift register unit from being insufficient after the touch phase is over, which results in insufficient pixel charging and display abnormality.

The principle that the charges at first node PUCN_N+1 leaks through the third transistor T3 in the touch phase is the same as the principle that the charges at the second node PU in the shift register unit shown in FIG. 1 leaks through the transistor T2 in the touch phase. When the leakage of the first node PUCN_N+1 in the touch phase is relatively severe, after the touch phase is over, the first transistor T1 is turned on under the control of the second voltage terminal V2. When the low potential of the first node PUCN_N+1 is transmitted to the second node PU_N+1, the potential of the second node PU_N+1 may be instantaneously reduced. Under the influence of the low potential of the second node PU_N+1, the fourth transistor T4 may be insufficiently turned on, resulting in insufficient output voltage of the signal output terminal OUT, thereby causing insufficient pixel charging and display abnormality.

In order to avoid this problem, in some embodiments, in the touch phase, as shown in FIG. 9, the voltages of the first voltage control terminal CN and the second voltage control terminal CNB of the shift register unit are controlled to be high level signals (i.e., CN=CNB=1, as shown by box 01 of FIG. 9) to reduce leakage of the first node PUCN of the shift register unit in the touch phase. In other words, in the touch phase, the voltage of the first voltage control terminal of the shift register unit and the voltage of the second voltage control terminal of the shift register unit are controlled to be both at high potentials, such that a potential of the first node of the shift register unit is maintained in the touch phase. The expression "being controlled to be both at high potentials" means that the voltage of the first voltage control terminal of is at a first high potential and the voltage of the second voltage control terminal is at a second high potential, wherein the first high potential and the second high potential can both be identified as "1" but it should be understand the actual potential of the first high potential and the actual potential of the second high potential may not be exactly the same. In this case, the gate-source voltage of the third transistor T3 is at a low level, and the source-drain voltage is about 0V. Referring to FIG. 4, if the characteristics of the transistors in the shift register unit are normal, then when the gate-source voltage $V_{gs}$ is at a low level, the magnitude of the leakage current $I_{ds}$ is on the order of 1E-11. Even if the characteristics of the transistors in the shift register unit are abnormal, the charge at the first node PUCN_N+1 would not leak because the second voltage control terminal CNB is at a high level, so the first node PUCN_N+1 can be maintained at a high level after the touch phase to avoid insufficient pixel charging.

In this way, the potential reduction of the first node PUCN_N+1 in the touch phase can be alleviated, so that after the touch phase is over, when the first node PUCN_N+1 is brought into conduction with the second node PU_N+1, the potential of the second node PU_N+1 would not be significantly reduced. Thus the fourth transistor T4 can be fully turned on, so that the output voltage of the signal output terminal OUT is sufficient, thereby further reducing the probability of insufficient pixel charging.

It should be noted that when the shift register unit is used for a reverse scan, the operation principle of the shift register unit and the principle for avoiding insufficient pixel charging of the shift register unit that needs to be initiated right after the touch phase is over is the same as that of a forward scan, therefore will not be described herein again.

In addition, the shift register unit shown in FIG. 7 does not comprise the seventh transistor T7 as compared with the shift register unit shown in FIG. 8. This is good for reducing the wiring space of the shift register unit and achieving a narrower frame.

According to another aspect of the present disclosure, a method of driving a shift register unit is provided, comprising the following steps: in the display phase, controlling a voltage of the second voltage terminal V2 of the shift register unit to be a first voltage, such that the first node PUCN is brought into conduction with the second node PU by the anti-leakage circuit 60 of the shift register unit, which allows the shift register unit to output gate scan signals normally under the control of the second node PU; and in the touch phase, controlling a voltage of the second voltage terminal V2 of the shift register unit to be a second voltage, such that the first node PUCN is brought out of conduction with the second node PU by the anti-leakage circuit 60 of the shift register unit.

It should be noted that when the first transistor T1 comprised in the anti-leakage circuit 60 is N-type, the first voltage is a high level, so that the first transistor T1 is turned on in the display phase. The second voltage is a low level, so that the first transistor T1 is turned off in the touch phase. When the first transistor T1 is P-type, the first voltage is a low level, so that the first transistor T1 is turned on in the display phase. The second voltage is a high level, so that the first transistor T1 is turned off in the touch phase. The display phase comprises an input phase, an output phase, a reset phase, and other non-output phases. The operation processes of the shift register unit in the phases of the display phase has been described in detail above, and will not be described herein again.

Since the first node PUCN is brought out of conduction with the second node PU in the touch phase, the leakage of the first node PUCN would not cause the leakage of the second node PU and the second node PU can be maintained at a high level, so that leakage of the second node PU in the touch phase can be avoided. This can in turn prevent the output voltage of the RS $(N+1)^{th}$ shift register unit from being insufficient after the touch phase is over, which results in insufficient pixel charging and display abnormality.

In some embodiments, the method of driving the shift register unit further comprises: in the touch phase, controlling the voltages of the first voltage control terminal CN and the second voltage control terminal CNB of the shift register unit to be at high levels to reduce the leakage current of the first node PUCN of the shift register unit in the touch phase. In this case, the leakage current of the first node PUCN in the touch phase can be reduced, so that after the touch phase is over, when the first node PUCN is brought into conduction with the second node PU, the second node PU is maintained at a high potential and the output voltage of the signal output terminal OUT is sufficient, thereby further reducing the probability of insufficient pixel charging.

According to yet another aspect of the present disclosure, a gate driving circuit is provided. As shown in FIG. 10, the gate driving circuit comprises a forward scan signal input terminal STV1, a reverse scan signal input terminal STV2, and N cascaded shift register units according to an embodiment of the present disclosure, where N is an integer greater than or equal to 2. Among the N cascaded shift register units, the first signal input terminal INPUT1 of the $1^{st}$ shift register unit (i.e., the first one of the N cascaded shift register units, which can also be expressed as the shift register unit at the first stage) is connected to the forward scan signal input terminal STV1 of the gate driving circuit, and is configured to receive forward scan input signals (i.e., start signals/initiating signals) in a start phase. It should be noted that the term "terminal" does not require a physical component, it may be a node in a wiring. Therefore, the expression that "the first signal input terminal INPUT1 is connected to the forward scan signal input terminal STV1 does not exclude the possibility that the first signal input terminal INPUT1 and the forward scan signal input terminal STV1 are physically the same component. The first signal input terminal of the $m^{th}$ shift register unit is connected to the signal output terminal of the $(m-1)^{th}$ shift register unit, where m is an integer and 2≤m≤N. The second signal input terminal of the $n^{th}$ shift register unit is connected to the signal output terminal of the $(n+1)^{th}$ shift register unit, where n is an integer and 1≤n<N. The second input terminal INPUT2 of the last one of the shift register units (i.e., the $N^{th}$ shift register unit) is connected to the reverse scan signal input terminal STV2 of the gate driving circuit, and is configured to receive reverse scan input signals (i.e., reset signals) in the reset phase.

It should be noted that the start signals of the forward scan signal input terminal STV1 may be used as the reset signals to reset the last stage shift register unit RS(x), or a reset signal may be input to the reverse scan signal input terminal STV2 separately. The clock signal clock1 of the first clock signal terminal CK and the clock signal clock2 of the second clock signal terminal CKB are complementary (i.e., when the shift register unit receives the first active clock signal, it simultaneously receives the second inactive clock signal; when the shift register unit receives the first inactive clock signal, it simultaneously receives the second active clock signal) and are switched after passing through each one of the shift register unit.

In an image frame, after the signal output terminal of the $n^{th}$ shift register unit outputs a signal, the gate driving circuit provided by the embodiments of the present disclosure enters the touch phase. In the touch phase, the anti-leakage circuit 60 of the $(n+1)^{th}$ shift register unit is controlled to be in a state that forbids the first node PUCN to be brought into conduction with the second node PU, so that the leakage of the second node PU of the $(n+1)^{th}$ shift register unit can be reduced, thereby reducing the probability of insufficient output voltage of the $(n+1)^{th}$ shift register unit, which results in insufficient pixel charging and display abnormality.

According to still another aspect of the present disclosure, a touch display device comprising the gate driving circuit according to an embodiment of the present disclosure is provided. The touch display device has the same structure and advantageous effects as the gate driving circuit provided in the foregoing embodiment, and will not be described herein again.

It should be noted that the touch display device may specifically comprise at least a liquid crystal display device and an organic light emitting diode display device. For example, the touch display device can be any product or component having a display function such as a liquid crystal display, a liquid crystal television, a digital photo frame, a mobile phone, or a tablet computer.

The above descriptions are merely specific embodiments of the present disclosure, but the protection scope of the present disclosure is not restricted thereto. All modifications and alternations conceivable to those skilled in the art, in the case of not departing from the spirit and scope of the present disclosure, should fall within the protection scope of the present disclosure. Therefore, the protection scope of the present disclosure should be defined by the claims. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

We claim:

1. A shift register unit, comprising:
   a first input circuit configured to bring a first voltage control terminal into conduction with a first node in response to an active potential of a first signal input terminal;
   a second input circuit configured to bring a second voltage control terminal into conduction with the first node in response to an active potential of a second signal input terminal;
   an output circuit configured to transmit a first active clock signal to a signal output terminal in response to an active potential of a second node;
   a first control circuit configured to bring a first voltage terminal into conduction with a third node in response to an active potential of the first node, and maintain the third node at a first potential in response to a second inactive clock signal and an inactive potential of the first node, wherein the first control circuit is configured to:
      in response to a second active clock signal, transmit the second active clock signal to the third node and store charges from the second active clock signal; and
      in response to the second inactive clock signal and the inactive potential of the first node, output the charges that have been stored to the third node, such that the third node maintains at the first potential;
   a second control circuit configured to, in response to an active potential of the third node, bring the first node into conduction with the first voltage terminal and bring the signal output terminal into conduction with the first voltage terminal; and
   an anti-leakage circuit configured to bring the first node into conduction with the second node in response to an active potential of a second voltage terminal,
   wherein the first control circuit comprises a fifth transistor, a sixth transistor, and a second capacitor,
   wherein a gate and one of a source and a drain of the fifth transistor are configured to receive the second active clock signal or the second inactive clock signal, and a different one of the source and the drain of the fifth transistor is connected to the third node,
   wherein a gate of the sixth transistor is connected to the first node, one of a source and a drain of the sixth transistor is connected to the third node, and a different one of the source and the drain of the sixth transistor is connected to the first voltage terminal, and
   wherein one terminal of the second capacitor is connected to the third node, and a different terminal of the second capacitor is connected to the first voltage terminal.

2. The shift register unit of claim 1, wherein the first potential is different from a potential of the first voltage terminal.

3. The shift register unit of claim 1,
   wherein the anti-leakage circuit comprises a first transistor, and
   wherein a gate of the first transistor is connected to the second voltage terminal, one of a source and a drain of the first transistor is connected to the first node, and a different one of the source and the drain of the first transistor is connected to the second node.

4. The shift register unit of claim 1,
   wherein the first input circuit comprises a second transistor, and
   wherein a gate of the second transistor is connected to the first signal input terminal, one of a source and a drain of the second transistor is connected to the first voltage control terminal, and a different one of the source and the drain of the second transistor is connected to the first node.

5. The shift register unit of claim 1,
   wherein the second input circuit comprises a third transistor, and
   wherein a gate of the third transistor is connected to the second signal input terminal, one of a source and a drain of the third transistor is connected to the first node, and a different one of the source and the drain of the third transistor is connected to the second voltage control terminal.

6. The shift register unit of claim 1,
   wherein the first input circuit comprises a second transistor,
   wherein a gate of the second transistor is connected to the first signal input terminal, one of a source and a drain of the second transistor is connected to the first voltage control terminal, and a different one of the source and the drain of the second transistor is connected to the first node, wherein the second input circuit comprises a third transistor, and wherein a gate of the third transistor is connected to the second signal input terminal, one of a source and a drain of the third transistor is connected to the first node, and a different one of the source and the drain of the third transistor is connected to the second voltage control terminal.

7. The shift register unit of claim 1, wherein the output circuit comprises a fourth transistor and a first capacitor, wherein a gate of the fourth transistor is connected to the second node, wherein one of a source and a drain of the fourth transistor is configured to receive the first active clock signal, and a different one of the source and the drain of the fourth transistor is connected to the signal output terminal, and wherein one terminal of the first capacitor is connected to the second node, and a different terminal of the first capacitor is connected to the signal output terminal.

8. The shift register unit of claim 1, wherein the first control circuit further comprises a seventh transistor, and wherein a gate of the seventh transistor is connected to the signal output terminal, one of a source and a drain of the seventh transistor is connected to the third node, and a different one of the source and the drain of the seventh transistor is connected to the first voltage terminal.

9. The shift register unit of claim 1, wherein the second control circuit comprises an eighth transistor and a ninth transistor, wherein a gate of the eighth transistor is connected to the third node, one of a source and a drain of the eighth transistor is connected to the first node, and a different one of the source and the drain of the eighth transistor is connected to the first voltage terminal, and wherein a gate of the ninth transistor is connected to the third node, one of a source and a drain of the ninth transistor is connected to the signal output terminal, and a different one of the source and the drain of the ninth transistor is connected to the first voltage terminal.

10. The shift register unit of claim 1, wherein transistors respectively comprised in the first input circuit, the second input circuit, the output circuit, the first control circuit, the second control circuit, and the anti-leakage circuit are single-gate transistors.

11. The shift register unit of claim 10, wherein the transistors are N-type transistors or are P-type transistors.

12. A method of driving the shift register unit according to claim 1, comprising:
in a display phase, controlling a voltage of the second voltage terminal of the shift register unit to be a first voltage, such that the first node is brought into conduction with the second node by the anti-leakage circuit of the shift register unit; and
in a touch phase, controlling a voltage of the second voltage terminal of the shift register unit to be a second voltage, such that the first node is brought out of conduction with the second node by the anti-leakage circuit of the shift register unit.

13. The method of claim 12, further comprising:
in the touch phase, controlling a voltage of the first voltage control terminal of the shift register unit and a voltage of the second voltage control terminal of the shift register unit to be both at high potentials, such that a potential of the first node of the shift register unit is maintained in the touch phase.

14. A gate driving circuit, comprising N shift register units according to claim 1 that are cascaded, N being an integer greater than or equal to 2; wherein among the N shift register units:
the first signal input terminal of an $m^{th}$ one of the N shift register units is connected to the signal output terminal of an $(m-1)^{th}$ one of the N shift register units, wherein m is an integer and $2 \leq m \leq N$, and
the second signal input terminal of an $n^{th}$ one of the N shift register units is connected to the signal output terminal of an $(n+1)^{th}$ one of the N shift register units, where n is an integer and $1 \leq n < N$.

15. The gate driving circuit of claim 14, wherein the first signal input terminal of a first one of the N shift register units is configured to receive a forward scan input signal, and the second signal input terminal of an $N^{th}$ one of the N shift register units is configured to receive a reverse scan input signal.

16. A touch display device, comprising the gate driving circuit of claim 14.

* * * * *